(12) United States Patent
Chavez et al.

(10) Patent No.: US 7,570,711 B1
(45) Date of Patent: Aug. 4, 2009

(54) QUADRATURE LINC TRANSMISSION METHOD AND APPARATUS

(75) Inventors: Carlos J. Chavez, Marion, IA (US); Gunther B. Frank, Robins, IA (US); Dennis L. Hoffman, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 508 days.

(21) Appl. No.: 10/414,931

(22) Filed: Apr. 16, 2003

(51) Int. Cl.
*H04L 27/36* (2006.01)

(52) U.S. Cl. .......................... 375/298; 330/10; 332/149; 375/261; 375/297; 375/300; 455/108; 455/114.3

(58) Field of Classification Search ................. 375/242, 375/261; 455/126; 330/10, 149
See application file for complete search history.

(56) References Cited

U.S. PATENT DOCUMENTS

| | | | | |
|---|---|---|---|---|
| 3,777,275 | A * | 12/1973 | Cox | ............................. 330/10 |
| 3,927,379 | A | 12/1975 | Cox et al. | |
| 4,178,557 | A | 12/1979 | Henry | |
| 5,847,602 | A * | 12/1998 | Su | ............................. 330/10 |
| 6,304,140 | B1 * | 10/2001 | Thron et al. | ................. 330/149 |

OTHER PUBLICATIONS

"LINC Transmitter", by S. A. Hetzel et al., Electronic Letters vol. 27, No. 10, May 9, 1991, pp. 844-846.

"A Power Re-Use Technique for Improved Efficiency of Outphasing Microwave Power Amplifiers", by R. Langridge et al., IEEE Transactions on Microwave Theory and Techniques, vol. 47, No. 8, Aug. 1999.
"Synergistic Design of DSP and Power Amplifiers for Wireless Communications", by P. M. Asbeck et al., IEEE Transactions on Microwave Theory and Techniques, vol. 49 No. 11, Nov. 2001.
"Power Amplifiers and Transmitters for RF and Microwave", by F. H. Raab et al., IEEE Transactions on Microwave Theory and Techniques, vol. 50, No. 3, Mar. 2002.

* cited by examiner

*Primary Examiner*—David C Payne
*Assistant Examiner*—Adolf Dsouza
(74) *Attorney, Agent, or Firm*—Daniel M. Barbieri

(57) ABSTRACT

A quadrature LINC transmission system processes a baseband input signal for transmission as a linearly amplified RF signal. An in-phase LINC element processes an in-phase baseband signal into an in-phase RF signal. A quadrature LINC element processes a quadrature baseband signal into a quadrature RF signal. An output combiner combines the in-phase RF signal with the quadrature RF signal to provide the linearly amplified RF signal. The in-phase LINC element has a constant envelope decomposition block for decomposing the in-phase baseband signal into in-phase baseband constant envelope components. Two up-converters convert the in-phase baseband constant envelope components to in-phase RF constant envelope components. Two non-linear amplifiers amplify the in-phase RF constant envelope components. A combiner combines the amplified in-phase RF constant envelope components to yield the in-phase RF signal. The quadrature LINC element is similar to the in-phase LINC element and provides the quadrature RF signal.

6 Claims, 8 Drawing Sheets

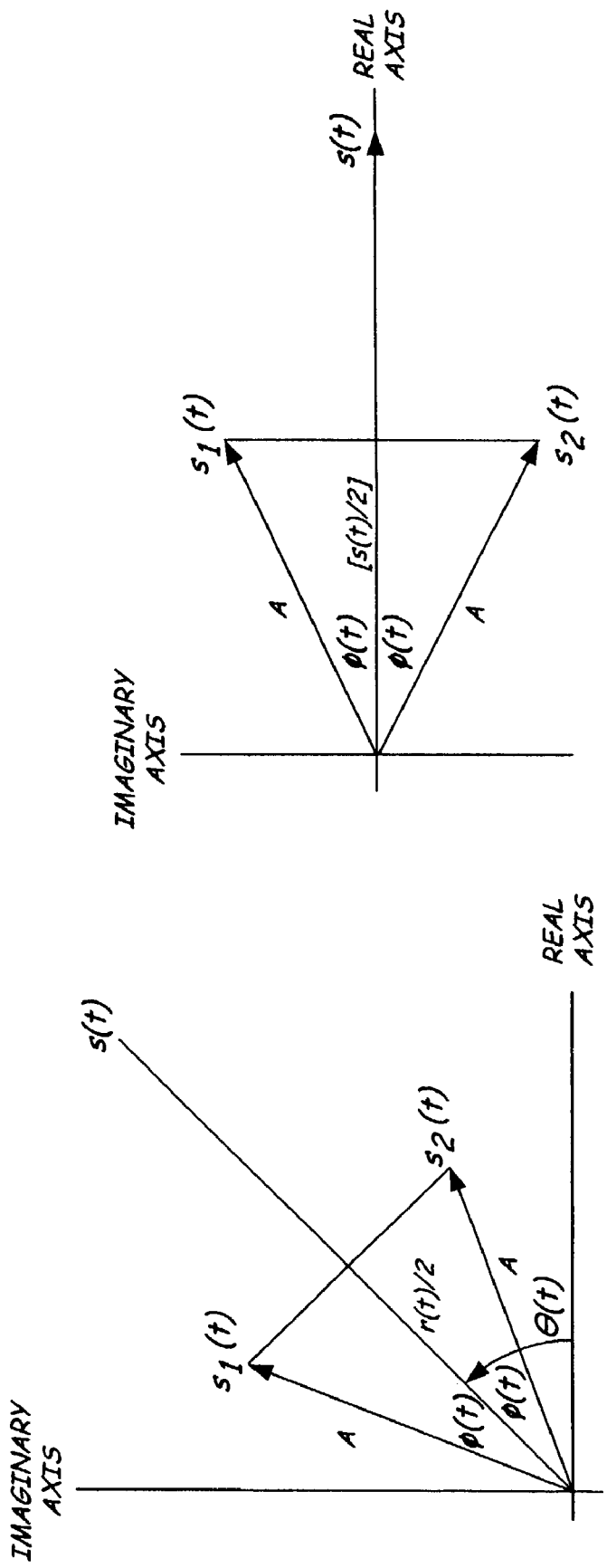

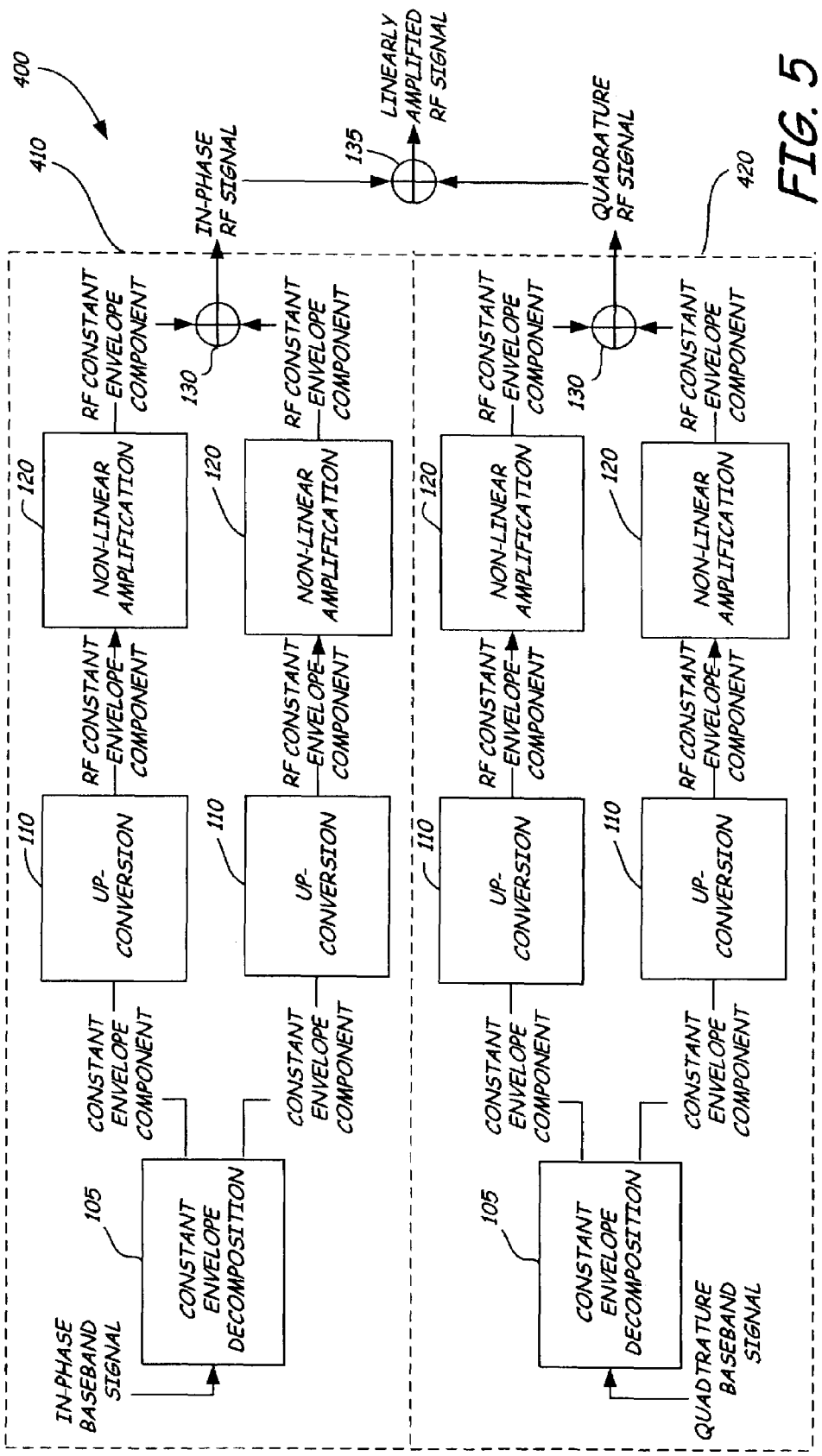

QUADRATURE LINC TRANSMISSION METHOD AND APPARATUS

BACKGROUND OF THE INVENTION

This invention relates to communications systems, transmission of signals, and specifically to a linear transmission of quadrature-modulated signals.

Power amplifiers are used in RF and microwave communications systems to amplify signals to desired power levels for transmission or further processing within the system. Some communications systems use CW, FM, FSK, GMSK signals that are constant envelope and do not require linear amplification. Other communications systems use modulations that vary amplitude and phase thereby requiring highly linear amplification. Such systems include SSB voice, pulse shaped data signals such as QAM, QPSK, and CDMA, and multicarrier signals such as OFDM. Modern spectrally efficient systems such as VHF Digital Link (VDL) Modes 2 and 3, which are part of the Global Air Traffic Management (GATM) system, use D8PSK with raised cosine pulse shaping and require linear transmission. However, highly linear performance is difficult to realize while simultaneously achieving high power efficiency.

A number of approaches exist to solve the linearity and efficiency problems. One such approach is linear amplification using non-linear components (LINC) or outphasing amplification. The outphased power amplifier was developed in the 1930s by H. Chireix to obtain high power linearity and efficiency for AM broadcast transmitters using vacuum tubes. In the 1970s the outphasing technique was applied to microwave power amplifiers under the names of LIND (linear amplification with nonlinear devices) and LINC. U.S. Pat. Nos. 3,777,275, 3,927,379, and 4,178,557 incorporated herein by reference disclose variations of the LIND approach.

In the basic LINC technique an envelope modulated signal is decomposed into two constant envelope components, each of which is a complex signal. The two constant envelope components with different time-varying phases are then each amplified by a highly nonlinear but very efficient amplifier. The two amplifier outputs are then combined to produce a linear high-power envelope modulated output signal. The phase variations of the two constant envelope complex signals cause the instantaneous vector sum of the two amplifier outputs to follow the desired modulation signal amplitude.

A problem with the LINC technique is that the constant envelope components must precisely cancel to prevent out-of-band frequency components in the output. Band limiting of the constant envelope components prior to non-linear amplification along with gain and phase mismatches in the two constant envelope signal component paths contribute to imperfect cancellation.

What is needed is an LINC technique that obtains high linearity and high efficiency while realizing a spectrally efficient system.

SUMMARY OF THE INVENTION

A quadrature linear amplification using non-linear components (LINC) transmission system to process a baseband input signal for transmission as a linearly amplified RF output signal is disclosed. The quadrature LINC transmission system comprises an in-phase LINC element that processes an in-phase baseband signal into an in-phase RF signal. A quadrature LINC element processes a quadrature baseband signal into a quadrature RF signal. An output combiner combines the in-phase RF signal from the in-phase LINC element with the quadrature RF signal from the quadrature LINC element to provide the linearly amplified RF output signal.

The in-phase LINC element has a constant envelope decomposition block that decomposes the in-phase baseband signal into in-phase baseband constant envelope components. Two up-converters are used to up-convert the in-phase baseband constant envelope components to in-phase RF constant envelope components. Two non-linear amplifiers amplify the in-phase RF constant envelope components. A combiner combines the amplified in-phase RF constant envelope components to yield the in-phase RF signal.

The quadrature LINC element has a constant envelope decomposition block for decomposing the quadrature baseband signal into quadrature baseband constant envelope components. Two up-converters are used to up-converting the quadrature baseband constant envelope components into quadrature RF constant envelope components. Two non-linear amplifiers amplify the quadrature RF constant envelope components. A combiner combines the amplified quadrature RF constant envelope components to yield the quadrature RF signal.

It is an object of the present invention to provide a highly linear transmission system while achieving high power efficiency.

It is an object of the present invention to provide a quadrature LINC transmission system that is a highly linear spectrally efficient communication system.

It is an advantage of the present invention to provide highly linear transmission of quadrature modulated signals.

It is an advantage of the present invention for a quadrature LINC transmission system to provide an improvement over current LINC transmission systems.

It is a feature of the present invention to require less bandwidth in constant envelope paths and be more tolerant to gain and phase mismatches between constant envelope paths compared to conventional LINC systems.

BRIEF DESCRIPTION OF THE DRAWINGS

The invention may be more fully understood by reading the following description of the preferred embodiments of the invention in conjunction with the appended drawings wherein:

FIG. 3 is a diagram showing constant envelope decomposition of a complex phasor in a LINC transmission system;

FIG. 4 is a diagram showing constant envelope decomposition of a real-valued phasor in a LINC transmission system;

FIG. 5 is a block diagram of a quadrature LINC transmission system of the present invention;

DETAILED DESCRIPTION

The present invention is for a method and apparatus that can achieve highly linear transmission of quadrature-modulated signals, while maintaining high power efficiency. Quadrature LINC transmission is an improvement upon the existing method know as LINC (linear amplification using non-linear components) transmission. Compared to LINC, quadrature LINC requires less bandwidth in the constant envelope component paths and is more tolerant to gain and phase mismatches between the constant envelope component paths.

Figure 1:
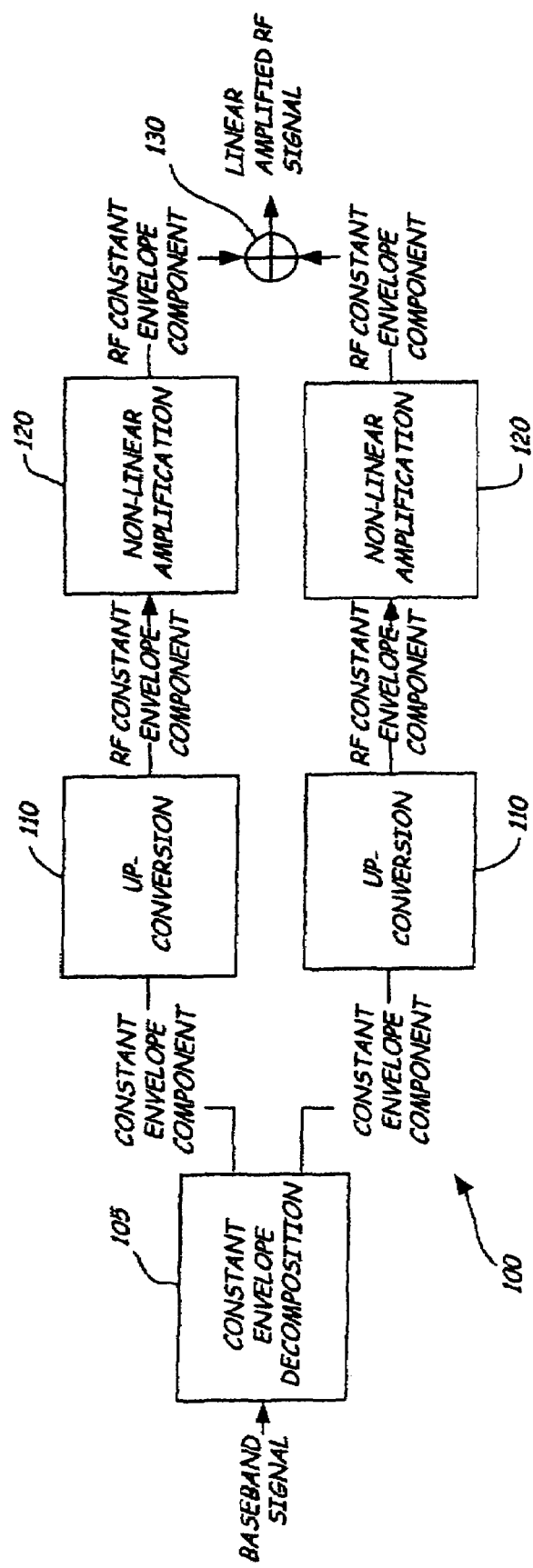
FIG. 1 is a block diagram of a conventional LINC transmission system.

FIG. 1 depicts a block diagram of a LINC transmission system 100, an existing method for achieving highly linear transmission while maintaining high power efficiency. A baseband signal is decomposed into two constant envelope components by a signal component separator or constant envelope decomposition block 105. Each constant envelope component is a complex baseband signal. These components are then up-converted to a desired radio frequency (RF) by up-converters 110 using techniques known in the art such as mixers and local oscillators to provide RF constant envelope components. The LINC transmission system 100 may operate with an RF input signal and perform constant envelope decomposition 105 at RF to eliminate the up-conversion 110. Because these RF signal components are constant envelope they can be amplified using non-linear but very efficient amplifiers 120. The amplifiers 120 may be of any type known in the art appropriate to the desired RF frequency range of operation such as vacuum tube, bipolar transistor, HEMT, pHEMT, HBT, etc. using a variety of materials and operating in non-linear modes such as class C, D, or E. The amplified RF constant envelope components are then combined in combiner 130 at high power levels to produce the desired linearly amplified RF signal. The combiner 130 may be a hybrid combiner known in the art.

Figure 2:
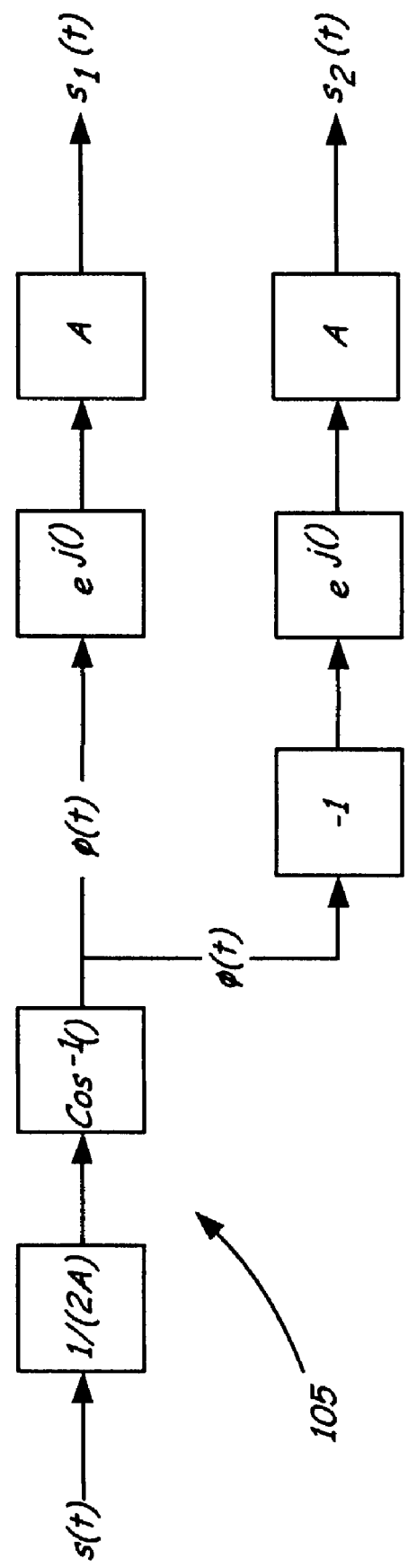
FIG. 2 is a block diagram of a digital signal processing approach to constant envelope decomposition.

As shown in FIG. 1, LINC transmission requires that the constant envelope decomposition 105 be performed to compute the two constant envelope components. Various approaches using analog techniques may be used to perform the constant envelope decomposition as shown in the reference patents. A digital signal processing (DSP) approach for constant envelope decomposition 105 may be used as shown in FIG. 2 and is described further below.

The constant envelope components are obtained in the following manner. A general RF bandpass signal can be represented as a baseband complex phasor s(t). The difference between the RF bandpass signal and the baseband complex phasor is the up-conversion 110 to RF.

$$s(t)=r(t)\angle(t) \text{ where } r(t)\epsilon[0, r_{max}] \text{ and } \theta(t)\epsilon[-\pi, \pi]$$

The same complex phasor can be decomposed into the sum of two constant envelope components $s_1(t)$ and $s_2(t)$ as shown below and in FIG. 3. The phasors $s_1(t)$ and $s_2(t)$ represent the constant envelope components that are the output of the constant envelope decomposition block 105 shown in FIG. 1.

$$s(t) = s_1(t) + s_2(t)$$
$$s_1(t) = A\angle\theta_1(t) \qquad \theta_1(t) = \theta(t) \pm \phi(t)$$
$$s_2(t) = A\angle\theta_2(t) \qquad \theta_2(t) = \theta(t) \pm [-\phi(t)]$$
$$\phi(t) = \cos^{-1}[r(t)/2A] \qquad \text{where } A = r_{max}/2$$

The polarities of $\phi(t)$ in the expressions for $\theta_1(t)$ and $\theta_2(t)$ always oppose each other and are continuously chosen to minimize the first derivatives of $\theta_1(t)$ and $\theta_2(t)$. This is done to contain the spectra of $s_1(t)$ and $s_2(t)$ when s(t) makes a transition through the origin.

For the special case where the phasor s(t) is real-valued, the following simplification occurs, as shown in FIG. 4. The constant envelope decomposition 105 shown in FIG. 2 is a block diagram representation of the mathematical operations in the equations below.

$$s(t)=s_1(t)+s_2(t) \text{ where } s(t)\epsilon[-r_{max}, r_{max}]$$

$$s_1(t)=A\angle\phi(t)$$

$$s_2(t)=A\angle-\phi(t)$$

$$\phi(t)=\cos^{-1}[s(t)/2A] \text{ where } A=r_{max}/2$$

As discussed previously, the LINC transmission system 100 works by separately amplifying two RF constant envelope signal components using highly non-linear but very power-efficient amplifiers 120. The amplified components are then combined at high power levels, resulting in the desired linearly amplified RF signal. While this technique does eliminate the need for highly linear amplifier components, it introduces a new set of potential problems.

The purpose of highly linear transmission is to realize a spectrally efficient communication system. Thus, the desired linearly amplified signal is spectrally well-contained. Therefore, the input baseband signal in FIG. 1, represented by the phasor s(t), is also spectrally well-contained. For the general case, s(t) is complex, representing a quadrature-modulated signal. As shown in the previous section, the phase $\theta_1(t)$ of the constant envelope component $s_1(t)$ is largely a function of the phase $\theta_1(t)$ of the input phasor s(t). In general, the derivative of $\theta(t)$ can be very large, which causes the derivative of $\theta_1(t)$ to be very large. This in turn causes the spectrum of the constant envelope component $s_1(t)$ to contain considerable energy outside of the occupied bandwidth of the input phasor s(t). The same is true for $s_2(t)$. Thus, the constant envelope components shown in FIG. 1 are, in general, not spectrally well-contained compared to the desired linearly amplified RF signal.

The LINC transmission system 100 sums together two signals that are not spectrally well-contained to produce a desired signal that is spectrally well-contained. In order for this to occur, the out-of-band frequency components of the two constant envelope components must cancel precisely. Anything that prevents this precise cancellation results in spectral re-growth in the linearly amplified RF signal, which defeats the purpose of linear transmission. One phenomenon that causes such spectral re-growth is band limiting of the constant envelope components prior to non-linear amplification. Gain and phase mismatches between the two constant envelope component paths also result in imperfect cancellation of out-of-band energy, and thus spectral re-growth.

Consequently, the LINC transmission system 100, in general, requires that the constant envelope components be processed with a bandwidth much wider than that of the desired linearly amplified RF signal. Also, the LINC transmission system 100 is sensitive to gain and phase mismatches between the constant envelope component paths.

However, it is important to examine the special case mentioned in the previous paragraphs. In this case the input baseband signal in FIG. 1, represented by the phasor s(t), is real-valued. As shown for real s(t), the phase of the constant envelope component $s_1(t)$ is simply $\phi(t)=\cos^{-1}[s(t)/2A]$. Because of the nature of the arccosine function, the first derivative of $\phi(t)$ is on the order of the first derivative of s(t). Consequently, $s_1(t)$ is spectrally contained on the order of s(t). The same is true for $s_2(t)$. Thus, the constant envelope components in FIG. 1 are spectrally well-contained when the input baseband signal is real-valued.

For a real-valued input signal, the LINC transmission system 100 sums together two signals that are spectrally well-contained to produce a desired signal that is spectrally well-contained. Consequently, precise cancellation of out-of-band frequency components is not required to the same extent as it is for the general case. As a result, the LINC transmission system 100 with a real-valued input signal requires far less bandwidth in the constant envelope component paths. Also, the LINC transmission system 100 is far less susceptible to spectral re-growth caused by gain and phase mismatches between the constant envelope component paths.

A quadrature LINC transmission system 400 of the present invention is shown in FIG. 5. The quadrature LINC transmission system 400 offers a significant improvement upon the LINC transmission system 100 of FIG. 1 for highly linear transmission of quadrature-modulated signals. The quadrature LINC system 400 achieves greater robustness by separating the complex baseband input signal into its in-phase and quadrature parts. The in-phase and quadrature signals are processed as real-valued input signals using one LINC transmission system 100 for each signal as described previously and then combined in quadrature to obtain the desired linearly amplified RF signal.

In FIG. 5, the in-phase baseband signal is processed in an in-phase LINC element 410. The in-phase LINC element 410 contains the functions of the LINC transmission system 100. In the in-phase LINC element 410, the in-phase baseband signal is decomposed by the constant envelope decomposition block 105 into two in-phase baseband constant envelope components. The two in-phase baseband constant envelope components are then up-converted by up-converters 110 to in-phase RF constant envelope components. The in-phase RF constant envelope components are then amplified by non-linear amplifiers 120 to provide two amplified in-phase RF constant envelope components. The outputs of the non-linear amplifiers 120 are combined in combiner 130 to yield an in-phase RF signal.

Likewise, the quadrature baseband signal is processed in a quadrature LINC element 420. The quadrature LINC element 420 again contains the functions of the LINC transmission system 100. In the quadrature LINC element 410, the quadrature baseband signal is decomposed by the constant envelope decomposition block 105 into two quadrature baseband constant envelope components. The two quadrature baseband constant envelope components are then up-converted by up-converters 110 to quadrature RF constant envelope components. The quadrature RF constant envelope components are then amplified by non-linear amplifiers 120 to provide two amplified quadrature RF constant envelope components. The outputs of the non-linear amplifiers 120 are combiner in combiner 130 to provide a quadrature RF signal.

The in-phase RF signal from the in-phase LINC element 410 is combined with the quadrature RF signal from the quadrature LINC element 420 in output combiner 135 to provide a desired linearly amplified RF output signal. The output combiner may be a hybrid combiner known in the art.

In operation the quadrature LINC transmission system 400 of the present invention performs constant envelope decomposition (block 105) of the in-phase and quadrature parts of the input signal as follows. Once again, a general RF bandpass signal can be represented as a baseband complex phasor s(t).

$$s(t)=r(t)\angle\theta(t) \text{ where } r(t)\epsilon[0, r_{max}] \text{ and } \theta(t)\epsilon[-\pi, \pi]$$

The same signal can also be represented in Cartesian form, with an in-phase (real) part i(t) and a quadrature (imaginary) part q(t). The phasors i(t) and q(t) represent the in-phase and quadrature input signals shown in FIG. 5.

$$s(t)=i(t)+jq(t)$$

Each rectangular component, i(t) and q(t), can be decomposed into two constant envelope components. Because i(t) is real valued, the simplification for real signals can be used as discussed previously.

$$i(t)=i_1(t)+i_2(t) \text{ where } i(t)\epsilon[-r_{max}, r_{max}]$$

$$i_1(t)=A\angle\phi_i(t)$$

$$i_2(t)=A\angle-\phi_i(t)$$

$$\phi_i(t)=\cos^{-1}[i(t)/2A] \text{ where } A=r_{max}/2$$

Since q(t) is real valued, it can also be decomposed using the simplification for real signals.

$$q(t)=q_1(t)+q_2(t) \text{ where } q(t)\epsilon[-r_{max}, r_{max}]$$

$$q_1(t)=A\angle\phi_q(t)$$

$$q_2(t)=A\angle-\phi_q(t)$$

$$\phi_q(t)=\cos^{-1}[q(t)/2A] \text{ where } A=r_{max}/2$$

Therefore, any general RF bandpass signal represented by the phasor s(t) can be represented as the sum of four constant envelope components, two of which are summed in quadrature. The four phasors $i_1(t)$, $i_2(t)$, $q_1(t)$, and $q_2(t)$ represent the four constant envelope components that are the outputs of the two constant envelope decomposition blocks 105 shown in FIG. 5.

$$s(t)=i_1(t)+i_2(t)+jq_1(t)+jq_2(t)$$

As explained above, the quadrature LINC transmission system 400 works by separately processing the in-phase and quadrature parts of a complex input baseband signal using in-phase LINC element 410 and quadrature LINC element 420. Because the in-phase and quadrature parts are each real-valued, the special case for LINC with a real-valued input baseband signal applies. As a result, the constant envelope components can be processed using a bandwidth far smaller than if a simple LINC transmission system 100 is used with a complex input baseband signal. Also, the quadrature LINC transmission system 400 is far more tolerant to gain and phase mismatches between constant envelope component paths than is simple LINC transmission.

For comparison, consider VHF Digital Link (VDL) Modes 2 and 3. These communication systems use 10,500 symbol/s D8PSK (differential 8-ary phase-shift keying) modulation with raised cosine pulse shaping (0.6 roll-off factor). The spectral emissions requirements for these two systems demand highly linear transmission as described in RTCA VDL Mode 2 MOPS and RTCA VDL Mode 3 MOPS.

Figure 6A:
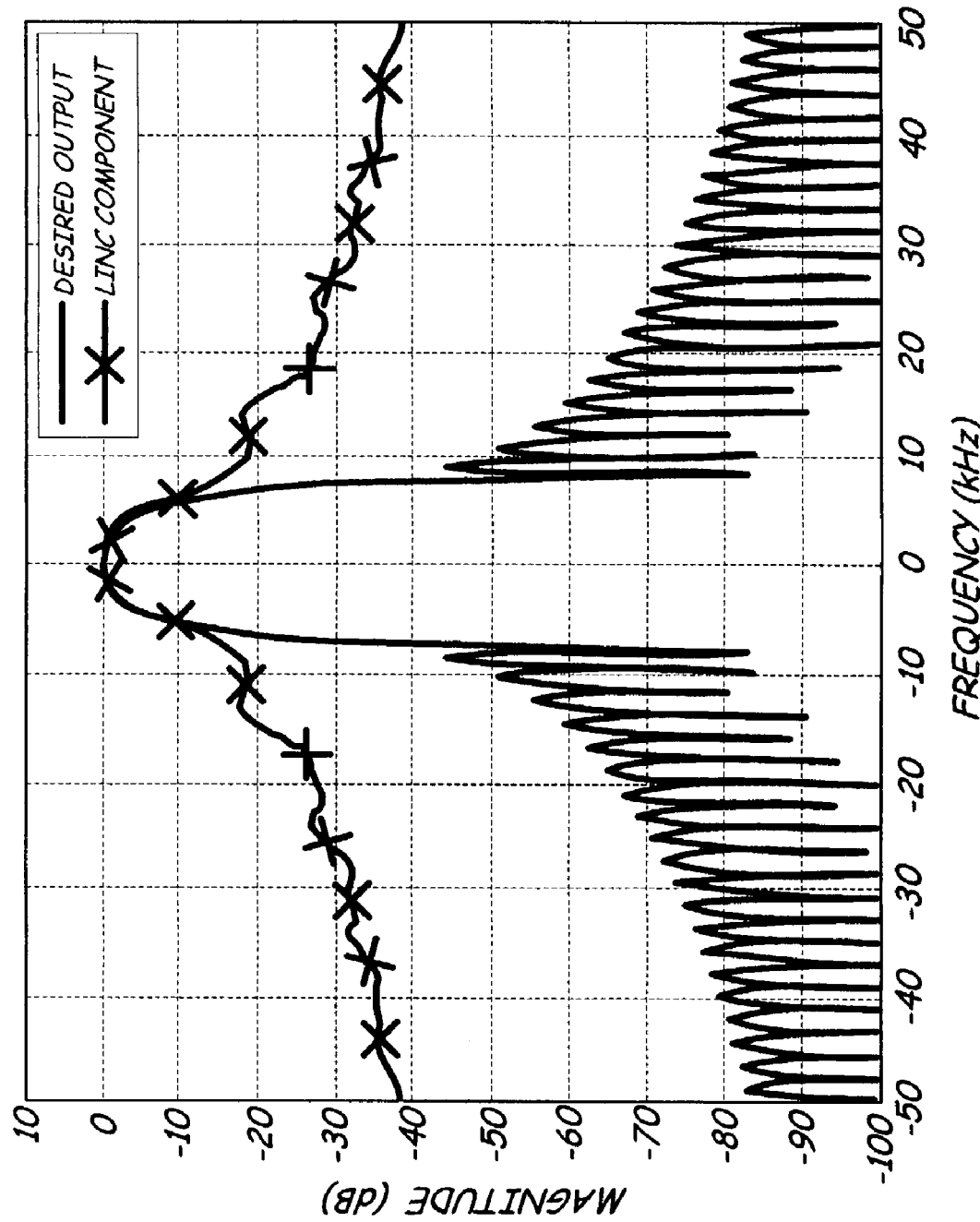
FIG. 6a shows a simulated estimate of the power spectrum for one constant envelope component when LINC transmission is used for D8PSK modulation and a power spectrum of a desired linearly amplified signal.
Figure 6B:
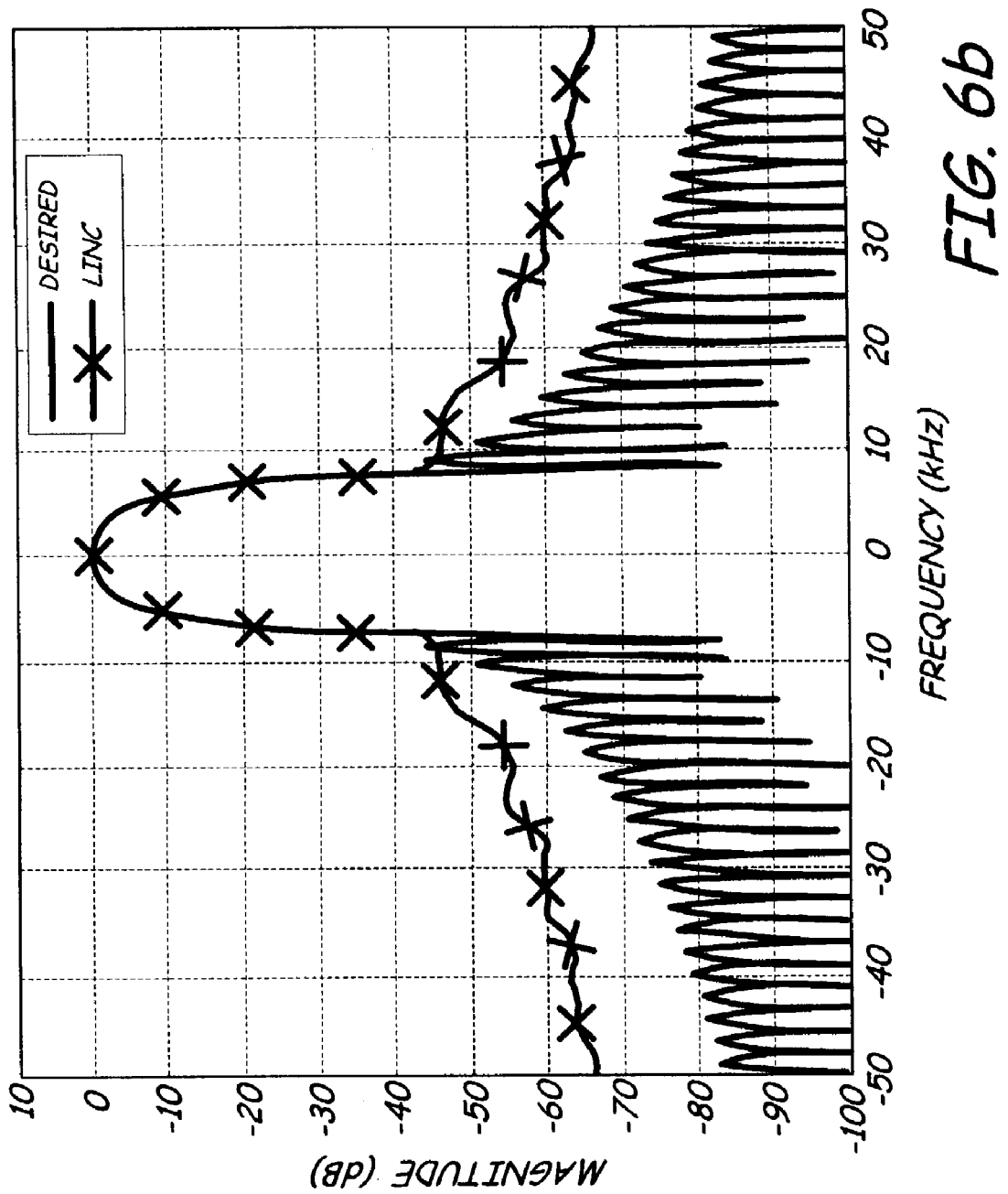
FIG. 6b shows a simulated power spectrum estimate for the linearly amplified D8PSK signal using LINC transmission with a gain and phase mismatch between the constant envelope component paths and the power spectrum of the desired linearly amplified signal.

FIG. 6a shows a simulated estimate of the power spectrum for one of the constant envelope components when LINC transmission system 100 is used to implement the D8PSK modulation for VDL Mode 2 or 3. Also shown for reference is the power spectrum of the desired linearly amplified RF signal. Notice how poorly contained the spectrum of the constant envelope component is compared to the desired signal. FIG. 6*b* shows a simulated power spectrum estimate for the linearly amplified D8PSK signal using LINC transmission system 100. This result is achieved with a 0.3-dB gain mismatch and a 2-degree phase mismatch between the constant envelope component paths. Also shown is the power spectrum of the desired linearly amplified RF signal. The signal amplified using LINC transmission system 100 is clearly not as spectrally contained as the desired signal. In fact, the LINC amplified signal does not meet the spectral emissions requirements for VDL Mode 2 or 3. To do so requires mismatches on the order of 0.06 dB and 0.4 degrees or less.

Figure 7A:
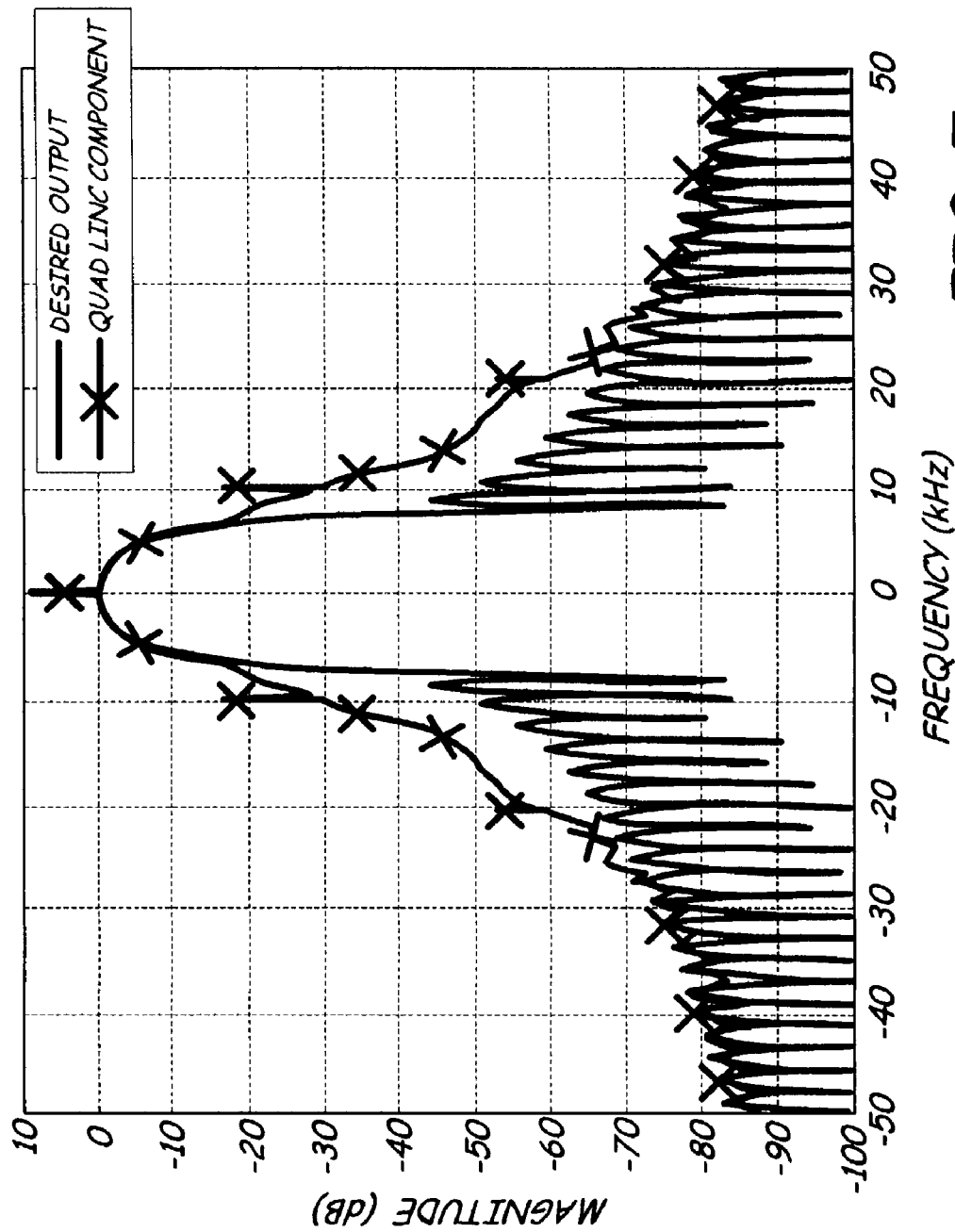
FIG. 7a shows a simulated power spectrum estimate for one of the constant envelope component when D8PSK modulation is used with quadrature LINC transmission system of the present invention and the power spectrum of the desired linearly amplified signal.
Figure 7B:
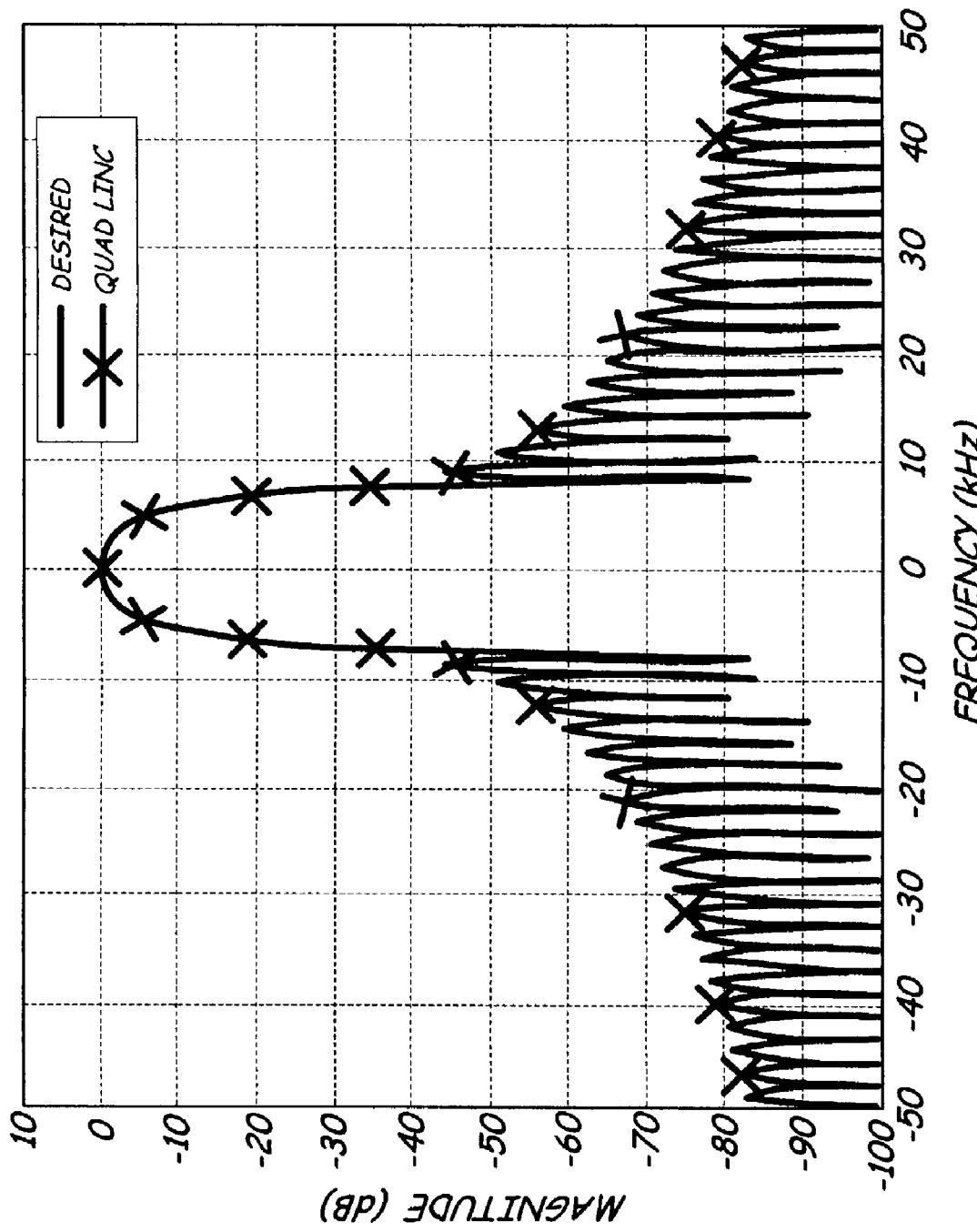
FIG. 7b shows a simulated power spectrum estimate for the linearly amplified D8PSK signal using the quadrature LINC transmission of the present invention with gains and phases of four constant envelope component paths mismatched for the worst case performance and the power spectrum of the desired linearly amplified signal.

FIG. 7*a* shows a simulated power spectrum estimate for one of the constant envelope components when the VDL Mode 2 or 3 D8PSK modulation is generated using the quadrature LINC transmission system 400 of the present invention. Also shown for reference is the power spectrum of the desired linearly amplified RF signal. Notice how much more contained the spectrum of the constant envelope component is for quadrature LINC transmission system 400 when compared to simple LINC transmission system 100. FIG. 7*b* shows a simulated power spectrum estimate for the linearly amplified D8PSK signal using quadrature LINC transmission system 400. In this case the gains and phases of the four constant envelope component paths are all within 0.3 dB and 2 degrees of each other. These mismatches are arranged amongst the four paths for the worst case performance. Also shown is the power spectrum of the desired linearly amplified signal. The spectrum of the signal amplified using quadrature LINC transmission 400 is almost identical to that of the desired signal. This result for quadrature LINC transmission system 400 is far superior to the result seen for simple LINC transmission system 100 as shown in FIG. 6*b*. Furthermore, the D8PSK signal generated using quadrature LINC transmission system 400 meets the spectral emission requirements for VDL Modes 2 and 3. The gain and phase mismatches used here for the quadrature LINC transmission system 400 are driven by the error vector magnitude (EVM) requirements for VDL Modes 2 and 3, rather than spectral containment.

It is believed that the quadrature LINC transmission method and apparatus of the present invention and many of its attendant advantages will be understood by the foregoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A quadrature linear amplification using non-linear components (LINC) transmission system to process a baseband input signal for transmission as a linearly amplified RF output signal comprising:
    an in-phase LINC element for processing an in-phase baseband signal into an in-phase RF signal, comprising:
        a constant envelope decomposition block for decomposing the in-phase baseband signal into two in-phase baseband constant envelope components;
        two up-converters for up-converting the two in-phase baseband constant envelope components to two in-phase RF constant envelope components;
        two non-linear amplifiers for amplifying the two in-phase RF constant envelope components; and
        a combiner for combining the two amplified in-phase RF constant envelope components to provide the in-phase RF signal;
    a quadrature LINC element for processing a quadrature baseband signal into a quadrature RF signal, comprising:
        a constant envelope decomposition block for decomposing the quadrature baseband signal into two quadrature baseband constant envelope components;
        two up-converters for up-converting the two quadrature baseband constant envelope components into two quadrature RF constant envelope components;
        two non-linear amplifiers for amplifying the two quadrature RF constant envelope components; and
        a combiner for combining the two amplified quadrature RF constant envelope components to provide the quadrature RF signal; and
    an output combiner for combining the in-phase RF signal from the in-phase LINC element with the quadrature RF signal from the quadrature LINC element to provide the linearly amplified RF output signal wherein the linearly amplified RF output signal satisfies the spectral emissions requirements of VHF Digital Link (VDL) Modes 2 and 3.

2. A method of processing a baseband input signal having in-phase and quadrature components for transmission as a linearly amplified RF output signal with a quadrature linear amplification using non-linear components (LINC) transmission system comprising the steps of:
    processing the in-phase baseband signal into an in-phase RF signal with an in-phase LINC element, comprising:
        decomposing the in-phase baseband signal into in-phase baseband constant envelope components with a constant envelope decomposition block;
        up-converting the in-phase baseband constant envelope components to in-phase RF constant envelope components with up-converters;
        amplifying the in-phase RF constant envelope components with non-linear amplifiers; and
        combining the amplified in-phase RF constant envelope components in a combiner to provide the in-phase RF signal;
    processing the quadrature baseband signal into a quadrature RF signal with a quadrature LINC element, comprising:
        decomposing the quadrature baseband signal into quadrature baseband constant envelope components with a constant envelope decomposition block;
        up-converting the quadrature baseband constant envelope components to quadrature RF constant envelope components with up-converters;
        amplifying the quadrature RF constant envelope components with non-linear amplifiers; and
        combining the amplified quadrature RF constant envelope components in a combiner to provide the quadrature RF signal; and
    combining the in-phase RF signal from the in-phase LINC element with the quadrature RF signal from the quadrature LINC element in an output combiner to provide the linearly amplified RF output signal wherein the linearly amplified RF output signal satisfies the spectral emissions requirements of VHF Digital Link (VDL) Modes 2 and 3.

3. A quadrature LINC transmission system to amplify a baseband input signal having in-phase and quadrature components to obtain a linearly amplified output signal comprising:

an in-phase LINC element for processing the in-phase baseband signal wherein said in-phase LINC element further comprises:

a constant envelope decomposition block for decomposing the in-phase baseband signal into two in-phase baseband constant envelope components;

two up-converters for up-converting the two in-phase baseband constant envelope components to in-phase RF constant envelope components;

two amplifiers for amplifying the in-phase RF constant envelope components to provide two amplified in-phase RF constant envelope components; and a combiner for combining the two amplified in-phase RF constant envelope components to yield an in-phase RF signal; and a quadrature LINC element for processing the quadrature baseband signal wherein said quadrature LINC element further comprises:

a constant envelope decomposition block for decomposing the quadrature baseband signal into two quadrature baseband constant envelope components;

two up-converters for up-converting the two quadrature baseband constant envelope components to two quadrature RF constant envelope components;

two amplifiers for amplifying the two quadrature RF constant envelope components to provide two amplified quadrature RF constant envelope components; and a combiner for combining the two amplified quadrature RF constant envelope components to yield a quadrature RF signal; and an output combiner for combining the in-phase RF signal from the in-phase LINC element with the quadrature RF signal from the quadrature LINC element to provide the linearly amplified RF output signal wherein the linearly amplified RF output signal satisfies the spectral emissions requirements of VHF Digital Link (VDL) Modes 2 and 3.

4. The quadrature LINC transmission system of claim 3 wherein said constant envelope decomposition blocks further comprise digital signal processors that decompose real valued in-phase and real valued quadrature baseband signals into two in-phase and two quadrature baseband constant envelope components.

5. The quadrature LINC transmission system of claim 4 wherein the digital signal processors decompose the baseband signals into two constant envelope components by separating the baseband signals into two signals of equal amplitude and equal phase angle with one signal phase angle being the negative of the other signal phase angle.

6. The quadrature LINC transmission system of claim 3 wherein said amplifiers are non-linear operating in one of the classes C, D, and E.

* * * * *